United States Patent

Pinarbasi

[19]

[11] Patent Number: 5,871,622

[45] Date of Patent: Feb. 16, 1999

[54] METHOD FOR MAKING A SPIN VALVE MAGNETORESISTIVE SENSOR

[75] Inventor: Mustafa Pinarbasi, Morgan Hill, Calif.

[73] Assignee: International Business Machines Corporation, Armonk, N.Y.

[21] Appl. No.: 862,453

[22] Filed: May 23, 1997

[51] Int. Cl.$^6$ .................................................. C23C 14/46
[52] U.S. Cl. ................................ 204/192.11; 204/192.2; 204/192.22
[58] Field of Search ........................... 204/192.11, 192.2, 204/192.22; 427/529

[56] References Cited

U.S. PATENT DOCUMENTS

| | | | |
|---|---|---|---|
| 5,206,590 | 4/1993 | Dieny et al. | 324/252 |
| 5,460,704 | 10/1995 | Davis | 204/192.2 |
| 5,465,185 | 11/1995 | Heim et al. | 360/113 |
| 5,492,720 | 2/1996 | Gill et al. | 427/131 |

FOREIGN PATENT DOCUMENTS

| | | | |
|---|---|---|---|
| 751499 | 6/1996 | European Pat. Off. . | |
| 0 751 499 A1 | 1/1997 | European Pat. Off. | G11B 5/39 |
| 08-129721 | 5/1996 | Japan | G11B 5/39 |

OTHER PUBLICATIONS

Bunshah et al., Deposition Technologies for Films and Coatings, Noyes Publications, Park Ridge, New Jersey, pp. 210–211. (no month available), 1982.

T. C. Anthony et al., "Magnetoresistance of Symmetric Spin Valve Structures", *IEEE Transactions on Magnetics,* vol. 30, No. 6, Nov. 1994, pp. 3819–3821.

S. F. Cheng et al., "Factors Affecting Performance of NiO Biased Giant Magnetoresistance Structures", *Journal of Applied Physics,* vol. 79, No. 8, Apr. 15, 1996, pp. 6234–6236.

B. A. Everitt et al., "Spin Valves with NiO Pinning Layer", *IEEE Transactions on Magnetics,* vol. 32, No. 5, Sep. 1996, pp. 4657–4659.

H. Hoshiya et al., "Giant Magnetoresistance of Spin Valve Films with NiO Antiferromagnetic Films", *Journal of the Magnetism Society of Japan,* vol. 18, No. 2, 1994, pp. 355–359. (No Month ; Abstract Only).

R. P. Michel et al., "NiO Exchange Bias Layers Grown by Direct Ion Beam Sputtering of a Nickel Oxide Target ", *IEEE Transactions on Magnetics,* vol. 32, No. 5, Sep. 1996, pp. 4651–4653.

J. X. Shen et al., "Exchange Coupling Between NiO and NiFe Thin Films", *Journal of Applied Physics,,* vol. 79, No. 8, Apr. 15, 1996, pp. 5008–5010.

*Primary Examiner*—Shrive Beck
*Assistant Examiner*—Timothy Meeks
*Attorney, Agent, or Firm*—Merchant, Gould, Smith, Edell, Welter & Schmidt, P.A.

[57] ABSTRACT

A process for making a spin valve magnetoresistive (SVMR) sensor includes forming a nickel-oxide (NiO) layer as the antiferromagnetic layer for pinning the magnetization of the pinned ferromagnetic layer in the SVMR sensor. The process includes forming the NiO layer directly on a substrate, which may be a wafer base having an alumina layer formed on it, by ion beam sputtering (IBS) a Ni target while simultaneously introducing oxygen into the IBS system. The high energy noble gas positive ions, which are typically Xe+ ions, eject the Ni atoms from the target with sufficient energy that they aid in the dissociation of the $O_2$ at the substrate surface. The Xe+ beam is non-neutralized, thus simplifying the process for forming the subsequent layers of the SVMR sensor and increasing the throughput of the system. The alumina substrate can be formed on the wafer base prior to formation of the NiO layer by ion sputtering an Al target in the IBS system in the presence of the same oxygen atmosphere used for the subsequently deposited NiO layer. The SVMR sensor made according to the process has a ferromagnetic layer pinned by a substantially greater exchange field from the NiO layer and significantly improved magnetoresistance over SVMR sensors with NiO antiferromagnetic layers formed by prior art processes.

22 Claims, 3 Drawing Sheets

METHOD FOR MAKING A SPIN VALVE MAGNETORESISTIVE SENSOR

TECHNICAL FIELD

This invention relates generally to a method for making a magnetoresistive sensor based on the spin valve effect, and more particularly to a method for making such a sensor with an improved antiferromagnetic layer.

BACKGROUND OF THE INVENTION

Giant magnetoresistance (GMR) has been observed in a variety of magnetic multilayered structures, the essential feature being at least two ferromagnetic metal layers separated by a nonferromagnetic metal layer. This GMR effect has been found in a variety of systems, such as Fe/Cr, Co/Cu, or Co/Ru multilayers exhibiting strong antiferromagnetic coupling of the ferromagnetic layers, as well as in essentially uncoupled layered structures in which the magnetization orientation in one of the two ferromagnetic layers is fixed or pinned. The physical origin is the same in all types of structures: the application of an external magnetic field causes a variation in the relative orientation of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure comprising two uncoupled ferromagnetic layers separated by a nonmagnetic metallic layer in which the magnetization of one of the ferromagnetic layers is pinned. The pinning may be achieved by depositing the layer onto an antiferromagnetic layer to exchange couple the two layers. This results in a spin valve magnetoresistive (SVMR) sensor in which only the unpinned or free ferromagnetic layer is free to rotate in the presence of an external magnetic field. IBM's U.S. Pat. No. 5,206,590 discloses a basic SVMR sensor for use as a read sensor or head for reading magnetically recorded data in a magnetic recording disk drive. IBM's U.S. Pat. No. 5,159,513 discloses a SVMR sensor in which at least one of the ferromagnetic layers is of cobalt or a cobalt alloy, and in which the magnetizations of the two ferromagnetic layers are maintained substantially perpendicular to each other at zero externally applied magnetic field by exchange coupling of the pinned ferromagnetic layer to an antiferromagnetic layer.

Most previously described SVMR sensors use Fe—Mn, typically $Fe_{50}Mn_{50}$, as the antiferromagnetic layer deposited on the pinned layer for exchange coupling to fix or pin the magnetization of the pinned layer. Through exchange anisotropy with the Fe—Mn antiferromagnet, the magnetization of the pinned layer is held rigid against small field excitations, such as those that occur from the signal field to be sensed. Fe—Mn couples to nickel-iron (Ni—Fe), cobalt (Co), and iron (Fe) with an interfacial energy of 0.08 erg/cm$^2$, and therefore is able to provide an exchange bias field in excess of the 200 Oerstead (Oe) for typical pinned layer magnetic moments. This is sufficient exchange energy to provide reasonably stable SVMR sensors. However, Fe—Mn has poor corrosion resistance.

All SVMR sensors have an interlayer exchange coupling field ($H_i$) between the free and pinned ferromagnetic layers caused by such things as magnetostatic interactions, pin holes in the films and electronic effects. It is desirable to have a SVMR sensor with a generally low $H_i$. SVMR sensors with the pinned layer on the bottom, i.e., on the substrate used to support the read head, require thinner Fe—Mn layers (e.g., 90 Å instead of 150 Å) to obtain an $H_i$ lower than approximately 25 Oe. However, thinner Fe—Mn layers are undesirable because they have a lower blocking temperature (e.g., 130° C. vs. 160° C.). The blocking temperature is the temperature above which the exchange field between the Fe—Mn antiferromagnetic layer and the pinned ferromagnetic layer vanishes.

For these reasons the use of nickel-oxide (NiO) as a replacement for Fe—Mn in SVMR sensors has been proposed. The properties of SVMR sensors with NiO antiferromagnetic layers has been described by H. Hoyashi et al., *Journal of the Magnetism Society of Japan*, Vol. 18, p. 355 (1994); and T. C. Anthony et al., *IEEE Trans. Mag.*, Vol. MAG-30, p. 3819 (1994). However, these results showed exchange bias fields of only about 100 Oe, which are too low for SVMR sensor applications. The NiO antiferromagnetic layers have been deposited by conventional DC or RF sputtering from a NiO target. Reactive DC or RF sputtering of a Ni target in the presence of an $Ar-O_2$ gas to form NiO antiferromagnetic layers has been described in IBM's European patent application EP-751499, published Jan. 2, 1997, and by Shen et al., "Exchange coupling between NiO and NiFe thin films", *J. Appl. Phys.* 79 (8), 15 Apr. 1996, pp. 5008–5010.

The use of direction beam sputtering of a NiO target in the absence of oxygen to form an NiO antiferromagnetic layer has been described by Michel et al., "NiO Exchange Bias Layers Grown by Direct Ion Beam Sputtering of a Nickel Oxide Target", *IEEE Trans. Mag.*, Vol. 32, No. 5, Sep. 1995, pp. 4651–4653. However, because NiO is an insulator the high energy positive ions directed at the NiO target will charge the target and ultimately prevent further ions from reaching it. Thus it is necessary to neutralize the beam by adding electrons from a hot filament wire located in the ion gun. The use of a neutralized beam complicates the SVMR sensor fabrication process because the neutralized beam is not needed to deposit the additional layers that make up the sensor and because the limited life of the filament requires the system to be shut down while the wire is replaced. In addition, the deposition rate reported by Michel et al. (0.1 Å/sec) would require approximately 70 minutes to deposit a 420 Å layer, which is far too slow for volume production of SVMR sensors. Such a long deposition time also increases the amount of oxygen that gets distributed throughout the system, which increases the wait time needed to clear the system of oxygen before subsequent layers of the SVMR sensor can be deposited.

What is needed is a process for depositing a NiO antiferromagnetic layer that is rapid and compatible with the deposition of the other SVMR sensor layers, and which results in a SVMR sensor with good corrosion resistance, high exchange coupling between the NiO antiferromagnetic layer and the pinned ferromagnetic layer, and a low $H_i$ between the free and pinned ferromagnetic layers.

SUMMARY OF THE INVENTION

The invention is a process for making a SVMR sensor that uses a NiO layer as the antiferromagnetic layer for pinning the magnetization of the pinned ferromagnetic layer. The process includes forming the NiO layer directly on a substrate, which may be a wafer base having an alumina layer formed on it, by ion beam sputtering (IBS) a Ni target while simultaneously introducing oxygen into the IBS system. The high energy noble gas positive ions, which are typically Xe+ ions, eject the Ni atoms from the target with sufficient energy that they aid in the dissociation of the $O_2$ at the substrate surface. The Xe+ beam is non-neutralized, thus simplifying the process for forming the subsequent layers of the SVMR sensor and increasing the throughput of the system. The alumina substrate can be formed on the wafer base prior to formation of the NiO layer by ion sputterring an Al target in the IBS system in the presence of the same oxygen atmosphere used for the subsequently deposited NiO layer. The SVMR sensor made according to the process has a ferromagnetic layer pinned by a substantially greater exchange field from the NiO layer and significantly improved magnetoresistance over SVMR sensors with NiO antiferromagnetic layers formed by prior art processes.

For a fuller understanding of the nature and advantages of the present invention, reference should be made to the following detailed description taken together with the accompanying figures.

DETAILED DESCRIPTION OF THE INVENTION

Prior Art

Figure 1:
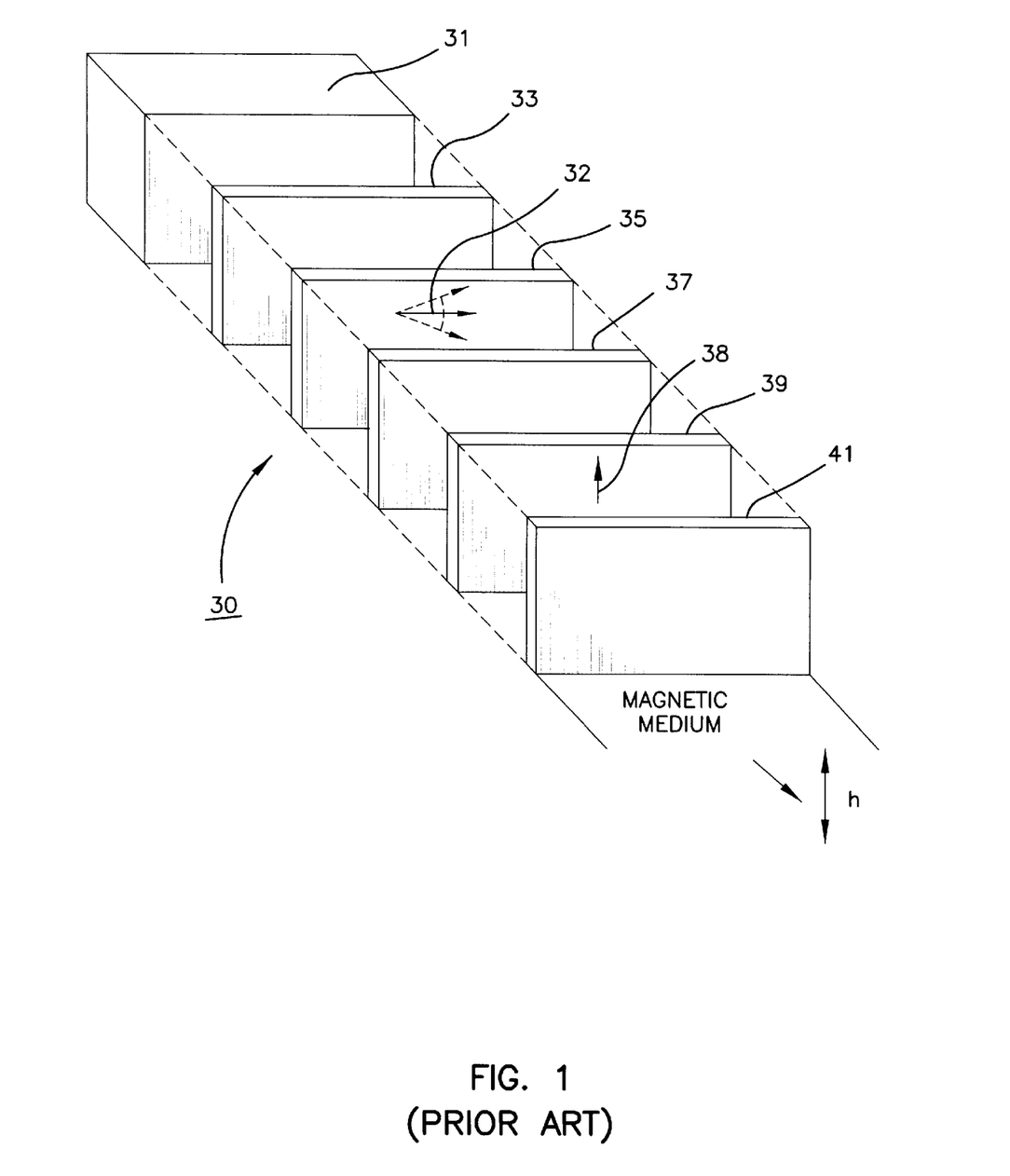
FIG. 1 is an exploded perspective view of a prior art SVMR sensor.

Referring to FIG. 1, a prior art SVMR sensor 30 comprises a suitable substrate 31 such as glass, ceramic, or a semiconductor, for example, upon which is deposited a buffer layer 33, a first thin layer 35 of soft ferromagnetic material, a thin nonferromagnetic metallic spacer layer 37, and a second thin layer 39 of ferromagnetic material. The SVMR sensor 30 may form the read part of a read/write transducer located on the trailing end of an air-bearing slider used in magnetic recording disk drives. The substrate 31 may be the trailing end of the slider. In the absence of an externally applied magnetic field h from the recorded magnetic medium (depicted in FIG. 1 as the surface on which the bottom edges of the films are supported), the magnetizations of the two layers 35, 39 of ferromagnetic material are oriented at an angle, preferably of about 90 degrees, with respect to each other, as indicated by arrows 32 and 38, respectively. The ferromagnetic layer 35 is called the "free" ferromagnetic layer in that its magnetization is free to rotate its direction in response to an externally applied magnetic field (such as magnetic field h shown in FIG. 1), as shown by the dashed arrows on layer 35. The ferromagnetic layer 39 is called the "pinned" ferromagnetic layer because its magnetization direction is fixed or pinned in a preferred orientation, as shown by the arrow 38. A thin film layer 41 of an exchange biasing material having relatively high electrical resistance is deposited in direct contact with the ferromagnetic layer 39 to provide a biasing field by exchange coupling. Layer 41 thus pins the magnetization of the ferromagnetic layer 39 in a preferred direction so that it cannot rotate its direction in the presence of an applied external magnetic field having a strength in the range of the signal field. The exchange bias layer 41 is typically a suitable antiferromagnetic material, such as iron-manganese (Fe—Mn) or nickel-manganese (Ni—Mn). The ferromagnetic layers 35 and 39 are typically formed of permalloy ($Ni_{(80+x)}Fe_{(20-x)}$, where x is greater than or equal to 0 and less than or equal to 5) or other ferromagnetic materials, such as Co, Fe, Ni, and their alloys, such as Ni—Fe, Ni—Co, and Fe—Co. The nonferromagnetic metallic spacer layer 37 is typically Cu.

While the pinned ferromagnetic layer 39 adjacent spacer layer 37 is typically a single Ni—Fe film, it is known to form this pinned layer as a two-film structure of a Ni—Fe film and a thin Co film adjacent the spacer layer 37. Similarly, the free ferromagnetic layer 35 may also include a thin Co film adjacent the spacer layer 37. These Co films increase the magnetoresistance of the sensor but are maintained relatively thin, typically in the range of 2–20 Å, to minimize the effect of the relatively hard magnetic Co material on the permeability of the SVMR sensor.

The SVMR sensor shown in FIG. 1 can also be "inverted", which means that the antiferromagnetic exchange biasing layer 41 is located on the seed layer 33 with the pinned ferromagnetic layer 39 located on and in direct contact with layer 41 and with the free ferromagnetic layer 35 being the top layer in the SVMR sensor. The SVMR sensor will also include a protective capping layer (not shown in FIG. 1), such as Ta, located over the top ferromagnetic layer.

DESCRIPTION OF THE PREFERRED EMBODIMENTS

Figure 2:
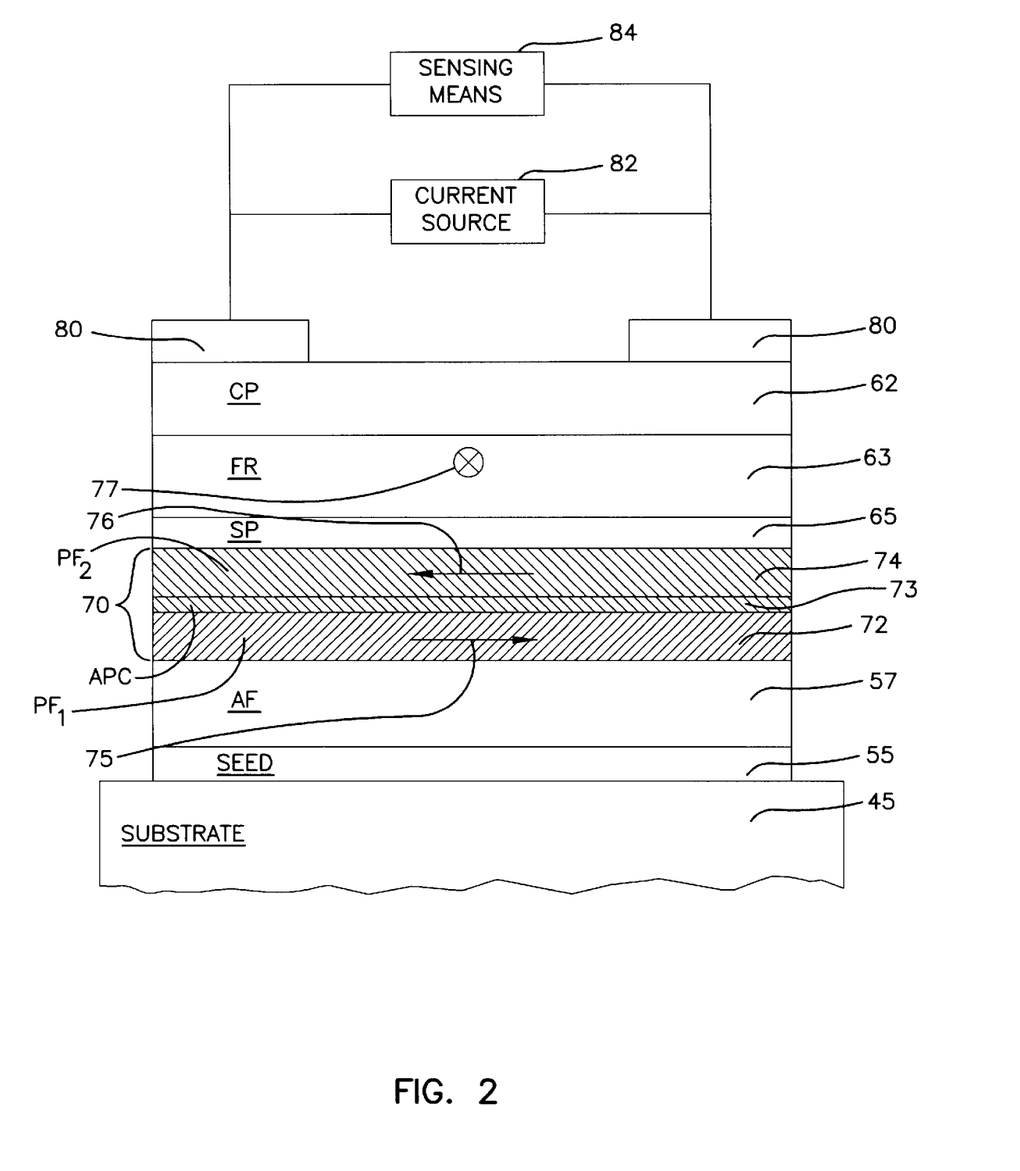
FIG. 2 is a sectional view of a prior art SVMR sensor using an NiO-based laminated antiparallel-pinned structure.

Referring to FIG. 2, an alternative structure for a SVMR sensor is depicted. This sensor is described in IBM's European patent application EP-751499 published Jan. 2, 1997, and discloses the use of NiO as the antiferromagnetic layer for pinning the pinned ferromagnetic layer. In addition, the single-layer pinned ferromagnetic layer (layer 39 in FIG. 1) is replaced by a laminated structure comprising at least two ferromagnetic films 72, 74 separated by a thin nonferromagnetic film 73 that provides antiparallel coupling (APC) of the two ferromagnetic films. This laminated antiparallel (AP) pinned layer is described in IBM's U.S. Pat. No. 5,465,185. The antiparallel coupling (APC) film 73 is of the appropriate type and thickness to allow the two ferromagnetic films 72, 74 to be antiferromagnetically coupled to one another. APC film 73 is ruthenium (Ru) approximately 2–8 Å thick. The laminated pinned layer 70 is then located on the bottom of the SVMR sensor near the substrate, and the antiferromagnetic (AF) layer 57 for pinning the laminated pinned layer is selected from a group of antiferromagnetic materials having relatively high corrosion resistance. Because of the use of the laminated pinned layer 70, the AF layer 57 may be of a material having a relatively low exchange anisotropy that would otherwise render it unsuitable for use in conventional SVMR sensors.

The SVMR sensor, as shown in FIG. 2, has a general structure according to the following: Substrate/Seed/AF/ $PF_1$/APC/$PF_2$/SP/FR/CP. The substrate 45 can be any suitable substance, including glass, semiconductor material, or a ceramic material, such as alumina ($Al_2O_3$). The seed layer 55 is any layer deposited to modify the crystallographic texture or grain size of the subsequent layers, and may not be needed depending on the substrate. If used, the seed layer may be formed of tantalum (Ta), zirconium (Zr), nickel-iron (Ni—Fe), or $Al_2O_3$. The antiferromagnetic (AF) layer 57 is nickel-oxide (NiO). The NiO AF layer 57 is deposited onto seed layer 55 has a thickness at which the desired exchange properties are achieved, typically 200–500 Å. The $PF_1$/APC/ $PF_2$ laminated pinned layer 70 is formed on AF layer 57. The two ferromagnetic layers 72, 74 ($PF_1$ and $PF_2$) are preferably formed of Co, have equal or nearly equal magnetic moment and are separated by an antiparallel coupling (APC) film 73 of nonmagnetic material that allows $PF_1$ and $PF_2$ to be strongly coupled together antiferromagnetically. The two Co films 72, 74 in the laminated AP-pinned layer 70 have their magnetization directions oriented antiparallel, as indicated by arrows 75, 76. The antiparallel alignment of the magnetizations of the two films 72, 74 is due to an antiferromagnetic exchange coupling through the APC film 73. Because of this antiferromagnetic coupling, and because the two Co films 72, 74 have substantially the same thickness, the magnetic moments of each of the films nearly cancel each other so that there is very little or essentially no net magnetic moment in the laminated AP-pinned layer 70. This results in an amplification of the exchange field above that which would be present if only layer 72 were used as a single pinned layer pinned by AF layer 57.

To complete the SVMR sensor of FIG. 2 a metallic spacer layer 65 (SP) is formed on the second ferromagnetic film 74, the free ferromagnetic layer 63 (FR) is formed on the spacer layer 65, and a capping layer 62 (CP) is formed on free ferromagnetic layer 63. In the absence of an applied field, the free ferromagnetic layer 63 has its magnetization axis oriented in the direction shown by arrow 77, i.e., generally perpendicular to the magnetization axes 75, 76 of the pinned films 72, 74.

FIG. 2 also illustrates schematically the means for connecting the SVMR sensor to sensing circuitry in the disk drive. Electrical leads 80 are provided to form a circuit path between the SVMR sensor and a current source 82 and a sensing means 84. As is well known in the art, additional sensor elements, such as transverse and longitudinal bias layers (not shown), may be required to provide an optimal SVMR sensor response circuit. In the preferred embodiment, a magnetic signal in the medium is sensed by the sensing means 84 detecting the change in resistance, deltaR, of the SVMR sensor as the magnetization of the free ferromagnetic layer 63 rotates in response to the applied magnetic signal from the recorded medium.

While the laminated pinned layer in the spin valve MR sensor has been shown with the preferred materials of Ni—Fe and Ru as the ferromagnetic and AF coupling film, respectively, other material combinations are possible, such as iron/chromium (Fe/Cr), and other ferromagnetic materials (such as Co, Fe, Ni, and their alloys, such as Ni—Fe, Ni—Co, and Fe—Co) with other AF coupling films (such as Ru, Cr, rhodium (Rh), iridium (Ir), and their alloys). However, for each such material combination, the oscillatory exchange coupling relationship, would have to be determined, if not already known, so that the thickness of the AF coupling film can be selected to assure antiferromagnetic coupling between the two ferromagnetic films. Also, while the pinned ferromagnetic film 72 adjacent Cu spacer layer 65 is a single Ni—Fe film, it is possible to form this pinned film as a two-film structure of a Ni—Fe film and a thin Co film adjacent the Cu spacer layer 65. Similarly, the free ferromagnetic layer 63 may also include a thin Co film adjacent the spacer layer 65.

Figure 3:
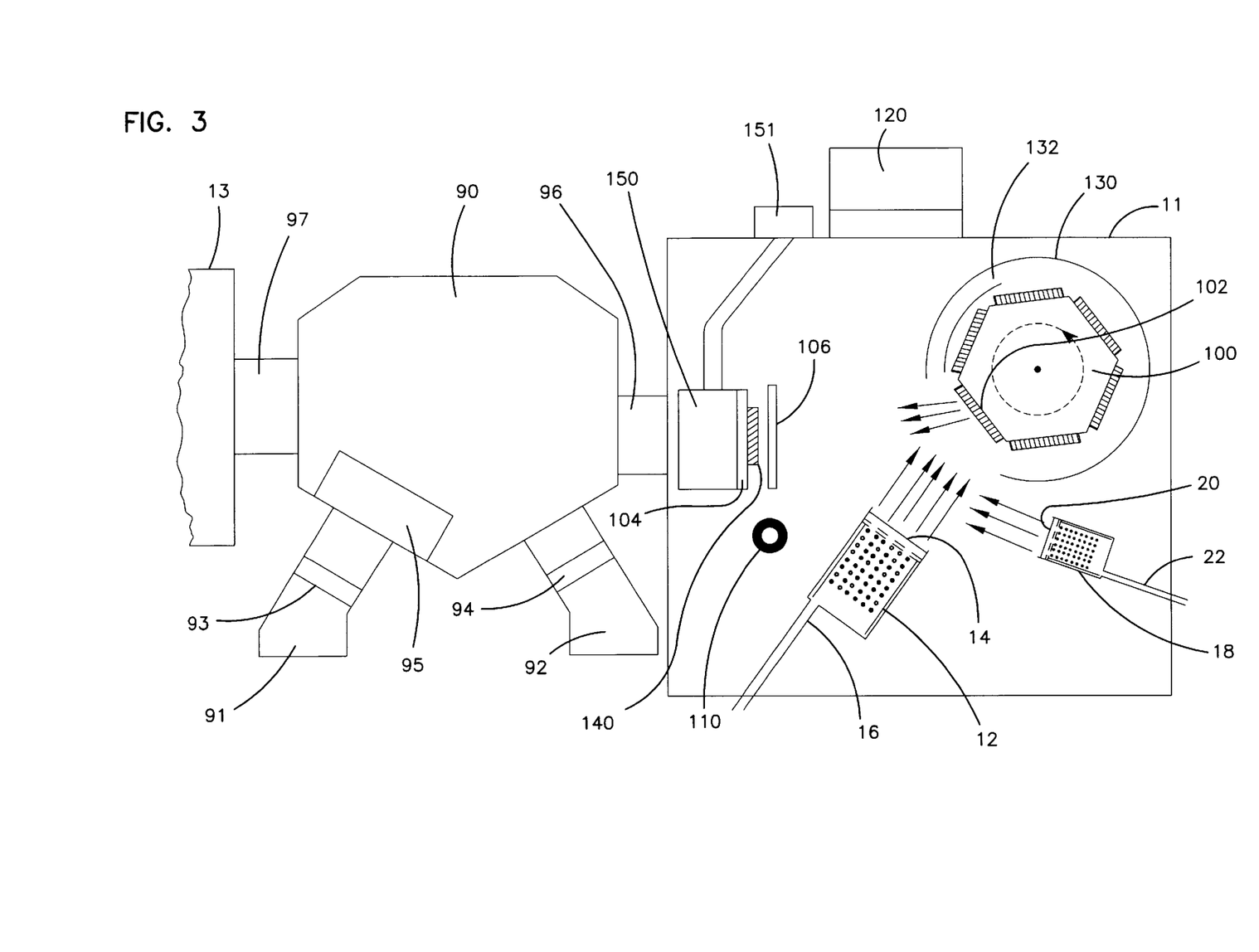
FIG. 3 is a diagram of the ion beam sputtering system for depositing the NiO antiferromagnetic exchange biasing layer according to the process of the present invention.

FIG. 3 is a schematic of the ion beam sputtering (IBS) system for use in the process of the present invention to deposit the layers that make up the SVMR sensor. The IBS system includes a sputtering chamber 11. A second sputtering chamber 13 identical to chamber 11 is separated from chamber 11 by a robot assembly 90. The wafers onto which the SVMR layers are formed are typically made of ceramic material, such as a composite of alumina ($Al_2O_3$) and titanium carbide (TiC) and are transferred into robot assembly 90 from elevators 91, 92 through respective gate valves 93, 94. The robot assembly 90 includes a wafer aligner 95 that is used to align the wafers for proper magnetic orientation of the magnetic films that are to be deposited. After alignment the robot assembly 90 transfers the wafers into the chambers 11, 13 through respective gate valves 96, 97.

A primary ion beam deposition gun 12 in sputtering chamber 11 includes a hot wire filament 14, typically formed of tungsten, that is used to generate electrons when it is necessary to provide a neutralized ion beam. A port 16 allows for the input of the gas to be ionized, which is typically a noble gas such as xenon (Xe) or argon (Ar). The IBS chamber 11 also includes an assist ion gun 18 which also includes its own hot wire filament 20 and gas input port 22. A rotatable target assembly 100 supports a plurality of sputtering targets, such as target 102 which is shown in position for receipt of the ion beam from ion gun 12. A substrate holder 104 supports the substrate 140 onto which the desired materials are to be deposited. A movable shutter 106 is located between the target 102 and the substrate 140 to block the incidence of atoms ejected from the target so that atoms reach the substrate only when desired. A target shield 130 surrounds the target assembly 100 and includes a movable target cover 132 that is used to protect the exposed target when the substrate 140 is being cleaned by the ion gun. A quartz crystal thickness monitor 110 is also located adjacent to substrate 140 to monitor the thickness of the films deposited. The IBS chamber 11 is evacuated by a pump 120 to maintain the desired low pressure within the chamber.

The process of the present invention uses the IBS system of FIG. 3 for depositing all of the layers making up the SVMR sensor and will now be described. The wafer, which will serve as the substrate 140, is loaded in the horizontal position by robot assembly 90 (in the plane of FIG. 3) through gate valve 96 onto the wafer stage 150 that supports substrate holder 104. A wafer stage angle drive 151 rotates the substrate holder 104 so that the substrate 104 is in the vertical plane as shown in FIG. 3. Following deposition of all of the SVMR sensor layers and subsequent lithographic patterning, the wafer is cut into a large number of pieces, each of which will ultimately form an air-bearing slider having a SVMR sensor located on its back or trailing edge.

First, the shutter 106 is moved out of position and the assist ion gun ejects Ar atoms onto the substrate 140 for a short period of time, approximately 30 sec., to clean the substrate surface. Next, the ion gun 12 is turned on and Xe is introduced into the gun to inject high energy positive Xe ions (Xe+) at an aluminum (Al) target, which has been positioned by the rotatable target assembly 100 to be in the path of the Xe beam. Because Al is a conductor, it is not necessary that the Xe+ ion beam be neutralized and thus the tungsten filament 14 is turned off. With the shutter 106 closed to block the substrate 140, the Xe+ beam is directed to the Al target briefly to clean the target surface. A mixture of Ar and oxygen ($O_2$) in the $Ar/O_2$ volume ratio of approximately 5:1 is introduced into the port 22 of assist ion gun 18 while the gun 18 is turned off. The sputtering of the Al target is then done for approximately 30 sec. to condition the system in the presence of the $Ar/O_2$ atmosphere for the subsequent alumina deposition. The shutter 106 is then opened to expose the substrate to the Al atoms that are ejected by the Xe+ ions that strike the Al target. A reactive deposition of alumina occurs and an alumina layer is deposited onto the substrate 140. If the substrate 140 is the SVMR wafer, the wafer can be considered the base onto which the alumina layer is deposited. The alumina layer will then serve as the substrate for the NiO antiferromagnetic layer.

Next, the shutter 106 is closed and the target assembly 100 is rotated to place a Ni target, consisting essentially of Ni of approximately 99.99% purity, into the path of the Xe+ beam. The Xe+ beam briefly cleans the Ni target, after which the shutter 106 is opened. The Ar—$O_2$ continues to be introduced into chamber 11 through port 22. The Ni atoms are ejected from the target by the high energy Xe+ beam and have an average energy in the range of approximately 15 eV. This high energy of the ejected Ni atoms aids in the dissociation of the $O_2$ at the surface of the substrate (i.e., the previously deposited alumina layer) and a NiO layer is deposited on the alumina layer. The NiO layer is deposited to a thickness of approximately 420 Å in approximately 10 minutes, for a deposition rate of 0.7 Å/sec. The NiO layer can also be deposited directly on the wafer substrate, without the need for an alumina layer. After the formation of the NiO layer, the IBS chamber 11 is pumped down by pump 120 to remove oxygen. This takes approximately 3–5 minutes.

After removal of the oxygen and with the shutter 106 closed, the other targets located on target assembly 100 are successively sputter cleaned by the Xe+ beam. These targets include permalloy (Ni—Fe), cobalt (Co), copper (Cu), ruthenium (Ru), and tantalum (Ta). The permalloy target is a ferromagnetic alloy target that consists essentially of $Ni_{(80+x)}Fe_{(20-x)}$, where x is greater than or equal to 0 and less than or equal to 5.

The subsequent layers making up the SVMR sensor are then deposited to form a structure having the arrangement of:

wafer base/500.$Al_2O_3$/420.NiO/18.Ni—Fe/10.Co/20.Cu/72.Ni—Fe/35.Ta.

Each of the layers deposited following the NiO layer are deposited with a non-neutralized Xe+ beam. Following deposition of the Ta protective layer, the wafer is removed to a load lock assembly (not shown) without breaking vacuum in the IBS system. Subsequent lithographic processing and cutting of the wafer then occurs to form the individual sliders with SVMR sensors.

Because all of the layers in the SVMR sensor can be deposited without the use of a neutralized beam, the throughput of the system is much higher because it is not necessary to shut down the system to replace the tungsten filaments, which have a limited lifetime. In addition, it has been discovered that the NiO layer deposited according to the process of the present invention, wherein a Ni target is bombarded with a high energy Xe+ beam in the presence of $O_2$ and the ejected Ni atoms have a sufficiently high energy to dissociate $O_2$ near the surface of the substrate, decreases the deposition time by one-fourth that required by the prior art use of an IBS system with a NiO target and no introduction of $O_2$.

Testing of the NiO layer formed according to the process confirmed that its composition is essentially stoichometric NiO.

A comparison of SVMR sensors made with the process according to the present invention versus the prior art SVMR sensors, wherein the NiO antiferromagnetic layer is formed by ion beam sputtering of a NiO target in the absence of oxygen, shows significant improvement in several important properties. First, the strength of the pinning field, i.e., the external applied field at which the pinned ferromagnetic layer in the SVMR sensor begins to rotate, was measured at 750 Oe for the SVMR sensor made according to the process of the present invention versus approximately 200 Oe for the SVMR sensor made by the prior art process. The exchange field imparted by the NiO antiferromagnetic layer on the pinned layer is typically slightly higher than one-half the measured pinning field. In comparative measurements for a SVMR sensor according to the structure of:

substrate/400 ÅNiO/30 ÅNiFe/Cu/30 ÅNiFe, the measured exchange field was 340 Oe for the SVMR sensor made according to the present invention versus 120 Oe for the SVMR sensor made by the prior art process. Also, the magnetoresistance ($\Delta R/R$) was measured at 5.5% versus 4.5%.

It is also possible in the present invention that the oxygen can be introduced through the gas port 16 of ion gun 12 together with the Xe+, instead of or in addition to being introduced through port 22 of assist ion gun 18. The oxygen can be introduced through the gas port 22 of assist ion gun 18 with the assist ion gun turned on, although this is a less desirable method because the oxygen reduces the lifetime of the tungsten filament.

While the process described above has been explained with respect to an SVMR sensor comprising two permalloy films (one of which has a thin Co film at the Cu interface) separated by the Cu spacer layer, as described in the previously cited U.S. Pat. No. 5,206,590 and shown in FIG. 1, the process may also be used to form the laminated antiparallel pinned SVMR sensor, as described in the previously cited published application EP-751499 and shown in FIG. 2.

The NiO layers can be deposited to form SVMR sensors of the inverted type, as described above with the NiO antiferromagnetic layer near the substrate, or SVMR sensors of the non-inverted type where the NiO layer is located on the top beneath the Ta capping layer.

In the preferred embodiment, the antiferromagnetic exchange bias layer is a layer consisting essentially of NiO. However, the process of the present invention has also been used to form antiferromagnetic layers which include NiO in addition to one or more metallic oxides. For example, the process has been used to sputter a Ni—Fe target to form an antiferromagnetic layer which includes NiO and oxides of iron.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope only as specified in the appended claims.

What is claimed is:

1. A method for depositing an antiferromagnetic film on a substrate comprising:

providing, in an ion beam sputtering chamber having a sputtering ion gun, a target formed of material selected from the group consisting of Ni and alloys of Ni and at least one other oxidizable metal, said alloys further being antiferromagnetic when oxidized, and a substrate to which atoms from said target are to be directed;

directing a non-neutralized beam of noble gas positive ions through the sputtering ion gun of the sputtering chamber to said target to eject atoms from said target toward the substrate;

introducing $O_2$ into the sputtering chamber for interaction with the atoms ejected from said target; whereby the energy of the atoms ejected from said target aid in the dissociation of the $O_2$ to form an antiferromagnetic film on the substrate, said antiferromagnetic film comprising NiO.

2. The method of claim 1 wherein the target is formed of an alloy of Ni and Fe and wherein the antiferromagnetic film formed on the substrate further comprises an oxide of Fe.

3. A method for depositing a film for use in a spin valve magnetoresistive sensor, the method comprising:
   providing, in an ion beam sputtering chamber having a sputtering ion gun and an ion assist gun, a target consisting essentially of Ni and a substrate to which Ni atoms from the Ni target are to be directed;
   directing a non-neutralized beam of noble gas positive ions through the sputtering ion gun of the sputtering chamber to the Ni target to eject Ni atoms from the Ni target toward the substrate;
   introducing $O_2$ into the sputtering chamber for interaction with the ejected Ni atoms; whereby the energy of the ejected Ni atoms aids in the dissociation of the $O_2$ to form an essentially stoichiometric film of NiO on the substrate.

4. The method of claim 3 wherein the noble gas is Xe.

5. The method of claim 3 further comprising introducing Ar gas into the sputtering chamber simultaneously with the $O_2$.

6. The method of claim 3 wherein the $O_2$ is introduced into the sputtering chamber through the ion assist gun of the sputtering chamber.

7. The method of claim 3 further comprising introducing $O_2$ into the sputtering chamber through the sputtering ion gun of the sputtering chamber simultaneously with directing noble gas positive ions through the sputtering ion gun of the sputtering chamber.

8. The method of claim 3 wherein providing a substrate comprises providing a base and depositing onto the base a film consisting essentially of $Al_2O_3$.

9. The method of claim 8 wherein depositing the $Al_2O_3$ film comprises providing an Al target, introducing $O_2$ into the sputtering chamber through the assist ion gun of the sputtering chamber, and directing a beam of noble gas positive ions through the sputtering ion gun of the sputtering chamber to the Al target to eject Al atoms from the Al target, whereby a film consisting essentially of $Al_2O_3$ is deposited on the base.

10. The method of claim 3 further comprising providing in the sputtering chamber a target of a ferromagnetic material and, without sputter etching the NiO film, directing noble gas positive ions through the sputtering ion gun of the sputtering chamber to the ferromagnetic target to deposit a first ferromagnetic layer directly on and in contact with the NiO film.

11. The method of claim 10 further comprising, prior to directing noble gas positive ions through the sputtering ion gun of the sputtering chamber to the ferromagnetic target, removing $O_2$ from the sputtering chamber.

12. The method of claim 10 wherein the ferromagnetic target consists essentially of $Ni_{(80+x)}Fe_{(20-x)}$, where x is greater than or equal to 0 and less than or equal to 5.

13. The method of claim 10 further comprising:
   depositing a film of Co on the first ferromagnetic layer by directing a beam of noble gas positive ions through the sputtering ion gun of the sputtering chamber to a Co target;
   depositing a film of Cu on the Co film by directing a beam of noble gas positive ions through the sputtering ion gun of the sputtering chamber to a Cu target; and
   depositing a second ferromagnetic layer on the Cu film by directing a beam of noble gas positive ions through the sputtering ion gun of the sputtering chamber to the ferromagnetic target.

14. The method of claim 10 wherein the first ferromagnetic layer is a laminated ferromagnetic layer and wherein depositing the laminated ferromagnetic layer on the NiO film comprises:
   directing a beam of noble gas positive ions through the sputtering ion gun of the sputtering chamber to successive targets of a ferromagnetic material, Ru, and a ferromagnetic material to deposit, in succession, a first ferromagnetic film directly on the NiO film, a Ru film directly on the first ferromagnetic film, and a second ferromagnetic film directly on the Ru film.

15. A method for depositing a stack of films for use in making a spin valve magnetoresistive sensor, the method comprising:
   providing, in an ion beam sputtering chamber having a sputtering ion gun and an ion assist gun, a base onto which the films are to be deposited;
   providing, in the ion beam sputtering chamber, a target consisting essentially of Ni, at least one ferromagnetic target, and a target consisting essentially of Cu;
   introducing $O_2$ into the sputtering chamber;
   directing a non-neutralized beam of noble gas positive ions through the sputtering ion gun of the sputtering chamber to the Al target to eject Al atoms from the Al target in the presence of the $O_2$, whereby a film consisting essentially of $Al_2O_3$ is deposited on the base;
   directing a non-neutralized beam of noble gas positive ions through the sputtering ion gun of the sputtering chamber to the Ni target to eject Ni atoms from the Ni target toward the $Al_2O_3$ film in the presence of the $O_2$, whereby the energy of the ejected Ni atoms aids in the dissociation of the $O_2$ to form an essentially stoichiometric film of NiO on the $Al_2O_3$ film;
   removing $O_2$ from the sputtering chamber;
   without sputter etching the NiO film, directing a non-neutralized beam of noble gas positive ions through the sputtering ion gun of the sputtering chamber to a ferromagnetic target to deposit a first ferromagnetic layer directly on and in contact with the NiO film;
   depositing a film of Cu on the first ferromagnetic layer by directing a non-neutralized beam of noble gas positive ions through the sputtering ion gun of the sputtering chamber to the Cu target; and
   depositing a second ferromagnetic layer on the Cu film by directing a non-neutralized beam of noble gas positive ions through the sputtering ion gun of the sputtering chamber to a ferromagnetic target.

16. The method of claim 15 wherein the noble gas is Xe.

17. The method of claim 15 further comprising introducing Ar gas into the sputtering chamber simultaneously with the $O_2$.

18. The method of claim 15 wherein the $O_2$ is introduced into the sputtering chamber through the ion assist gun of the sputtering chamber.

19. The method of claim 15 further comprising introducing $O_2$ into the sputtering chamber through the sputtering ion gun of the sputtering chamber simultaneously with directing noble gas positive ions through the sputtering ion gun of the sputtering chamber.

20. The method of claim 15 wherein the at least one ferromagnetic target consists essentially of $Ni_{(80+x)}Fe_{(20-x)}$, where x is greater than or equal to 0 and less than or equal to 5.

21. The method of claim 15 further comprising:
   prior to depositing the Cu film, providing a target consisting essentially of Co in the ion beam sputtering chamber and directing a non-neutralized beam of noble gas positive ions through the sputtering ion gun of the sputtering chamber to the Co target to deposit a Co film on the first ferromagnetic layer.

22. The method of claim 15 wherein the first ferromagnetic layer is a laminated ferromagnetic layer and wherein depositing the laminated ferromagnetic layer on the NiO film comprises:

providing, in the ion beam sputtering chamber, a target consisting essentially of Ru; depositing a first ferromagnetic film on the NiO film by directing a non-neutralized beam of noble gas positive ions through the sputtering ion gun of the sputtering chamber to a ferromagnetic target; depositing a Ru film on the first ferromagnetic film by directing a non-neutralized beam of noble gas positive ions through the sputtering ion gun of the sputtering chamber to the Ru target; and depositing a second ferromagnetic film on the Ru film by directing a non-neutralized beam of noble gas positive ions through the sputtering ion gun of the sputtering chamber to a ferromagnetic target; whereby the first ferromagnetic layer is formed as a laminated layer of two ferromagnetic films separated by a Ru film.

* * * * *

UNITED STATES PATENT AND TRADEMARK OFFICE
CERTIFICATE OF CORRECTION

PATENT NO.     : 5,871,622
DATED          : February 16, 1999
INVENTOR(S)    : Pinarbasi It is certified that error appears in the above-identified patent and that said Letters Patent is hereby corrected as shown below:

<u>Column 2,</u>
Line 26, please replace "direction" with -- direct ion --.

Signed and Sealed this

Twenty-eighth Day of May, 2002

*Attest:*

*Attesting Officer*

JAMES E. ROGAN
*Director of the United States Patent and Trademark Office*